(12) United States Patent
Ochiai et al.

(10) Patent No.: US 12,085,368 B2
(45) Date of Patent: Sep. 10, 2024

(54) LASER IRRADIATION APPARATUS AND STORAGE MEDIUM STORING LASER IRRADIATION PROGRAM

(71) Applicant: MITSUBISHI HEAVY INDUSTRIES, LTD., Tokyo (JP)

(72) Inventors: Atsushi Ochiai, Tokyo (JP); Kazunori Masukawa, Tokyo (JP)

(73) Assignee: MITSUBISHI HEAVY INDUSTRIES, LTD., Tokyo (JP)

(*) Notice: Subject to any disclaimer, the term of this patent is extended or adjusted under 35 U.S.C. 154(b) by 727 days.

(21) Appl. No.: 17/268,701

(22) PCT Filed: Sep. 3, 2019

(86) PCT No.: PCT/JP2019/034541
§ 371 (c)(1),
(2) Date: Feb. 16, 2021

(87) PCT Pub. No.: WO2020/152903
PCT Pub. Date: Jul. 30, 2020

(65) Prior Publication Data
US 2021/0231414 A1   Jul. 29, 2021

(30) Foreign Application Priority Data
Jan. 25, 2019   (JP) ................ 2019-011203

(51) Int. Cl.
*F41H 13/00*     (2006.01)
*G01S 7/481*     (2006.01)
(Continued)

(52) U.S. Cl.
CPC ........ *F41H 13/0062* (2013.01); *G01S 7/4815* (2013.01); *G01S 17/42* (2013.01); *G01S 17/89* (2013.01)

(58) Field of Classification Search
CPC .... F41H 13/0062; G01S 7/4815; G01S 17/42; G01S 17/89; G01S 17/66; H01S 5/18344;
(Continued)

(56) References Cited

U.S. PATENT DOCUMENTS 6,396,577 B1   5/2002   Ramstack
6,414,746 B1*  7/2002   Stettner ................. G01S 17/894
                                                 250/332
(Continued)

FOREIGN PATENT DOCUMENTS

CN   105372827    3/2016
CN   107514936   12/2017
(Continued)

OTHER PUBLICATIONS

Japanese Patent Office Notice of Reasons for Refusal for Japanese Patent Application No. 2019-011203 dated Jul. 5, 2022, (Year: 2022).*

(Continued)

*Primary Examiner* — David E Smith
*Assistant Examiner* — Christopher J Gassen
(74) *Attorney, Agent, or Firm* — Wenderoth, Lind & Ponack, L.L.P.

(57) ABSTRACT

A laser irradiation apparatus that efficiently carries out processes such as target detection. The laser irradiation apparatus (1) is provided with a laser array (10), a detector (20) and a controller (30). The laser array is provided with a plurality of laser oscillators including a first laser oscillator (11) that irradiates first detection laser light and a second laser oscillator (11) that irradiates second dealing laser light. The detector obtains detection information based on reflected light (503) that is the first detection laser light reflected by a target (2). The controller estimates a position of the target based on the detection information and gener- (Continued)

ates a second dealing signal that instructs to irradiate the second dealing laser light to the estimated position of the target. The second laser oscillator irradiates dealing laser light to the estimated position of the target based on the second dealing signal.

15 Claims, 10 Drawing Sheets

(51) Int. Cl.
*G01S 17/42* (2006.01)
*G01S 17/89* (2020.01)
(58) Field of Classification Search
CPC ............... H01S 5/18386; H01S 5/4056; H01S 5/02326; H01S 5/50
See application file for complete search history.

(56) References Cited

U.S. PATENT DOCUMENTS

| | | |
|---|---|---|
| 8,301,027 B2 | 10/2012 | Shaw et al. |
| 9,292,757 B1 | 3/2016 | Sivertsen |
| 2018/0100733 A1 | 4/2018 | Thuries et al. |

FOREIGN PATENT DOCUMENTS

| | | |
|---|---|---|
| CN | 207051590 | 2/2018 |
| CN | 207231315 | 4/2018 |
| JP | 2010-127818 | 6/2010 |
| JP | 2013-016591 | 1/2013 |
| JP | 2014-098873 | 5/2014 |
| JP | 2017-072557 | 4/2017 |
| JP | 2017-157609 | 9/2017 |

OTHER PUBLICATIONS

International Search Report issued Nov. 19, 2019 in International (PCT) Application No. PCT/JP2019/034541.
Partial Supplementary European Search Report issued Jul. 23, 2021 in European Patent Application No. 19911400.0.
Extended European Search Report issued Jun. 3, 2022 in corresponding European Patent Application No. 22162930.6.
Translation of the International Preliminary Report on Patentability issued Aug. 5, 2021 in International Application No. PCT/JP2019/034541.

* cited by examiner

LASER IRRADIATION APPARATUS AND STORAGE MEDIUM STORING LASER IRRADIATION PROGRAM

TECHNICAL FIELD

The present invention relates to a laser irradiation apparatus and a storage medium that stores a laser irradiation program.

BACKGROUND ART

Technologies of irradiating a target with high-power laser light to remotely destroying the target are researched. For example, Patent Literature 1 discloses a technology of irradiating high-power continuous wave laser light to destroy a target. An apparatus described in the Patent Literature 1 converts high-power continuous wave laser light to pulse laser light by pulse converter and irradiates the converted laser light to the target. An optical sensor receives reflected light of this laser light and detects the target. A controller stops pulse conversion process of the pulse converter so that continuous wave laser light is irradiated to the target and the target is destroyed.

In addition, a technology of changing irradiation direction of laser light non-mechanically is researched. For example, Patent Literature 2 discloses a technology of changing laser irradiation direction by wavelength. An apparatus described in the Patent Literature 2 is provided with a waveguide having two distributed Bragg reflection mirrors, a light incident port for incident light in the waveguide and a light emission port for emitting light that is guided in the waveguide.

Patent Literature 3 discloses a technology of changing irradiation direction of high-power laser non-mechanically. The apparatus disclosed in the Patent Literature 3 is provided with a first vertical cavity surface emitting laser (VCSEL) long in a first direction and a driving circuit that injects current to the first VCSEL. Incident light, that incidents in the incident port provided at an end in the first direction of the first VCSEL, travels inside the first VCSEL along the first direction, while being reflected in a vertical direction, and is emitted from the emitting port on an upper surface of the first VCSEL as emission light. It is disclosed that a direction in which this emission light is emitted is inclined to the first direction from a normal direction of the emitting port based on a wavelength of the incident light and the like.

CITED LIST

Patent Literature

[Patent Literature 1] Japanese Patent Publication No. 2010-127818 A
[Patent Literature 2] Japanese Patent Publication No. 2013-16591 A
[Patent Literature 3] Japanese Patent Publication No. 2017-157609 A

SUMMARY OF INVENTION

The present invention has been made in view of the above circumstances and one objective thereof is to provide a laser irradiation apparatus that efficiently carries out processes such as detection of target by use of laser light. Other objectives will be understood from following disclosures and explanations of embodiments.

The laser irradiation apparatus according to an embodiment to achieve the above objective is provided with a laser array, a detector and a controller. The laser array is provided with a plurality of laser oscillators including a first laser oscillator that irradiates first detection laser light and a second laser oscillator that irradiates second dealing laser light. The detector obtains detection information based on reflected light that is the first detection laser light reflected by a target. The controller estimates a position of the target based on the detection information and generate a second dealing signal that instructs the second laser oscillator to irradiate the second dealing laser light to the estimated position of the target. The second laser oscillator irradiates the second dealing laser light to the estimated position of the target based on the second dealing signal.

The laser irradiation apparatus according to an embodiment is provided with a laser array with a plurality of laser oscillators arranged in an array. The plurality of laser oscillators is provided with a first laser oscillator group including a part of laser oscillators of the plurality of laser oscillators and a second laser oscillator group including a part of laser oscillators of the plurality of laser oscillators. The first laser oscillator group irradiates a first laser light group in a first direction to display a first image in the first direction. The second laser oscillator group irradiates a second laser light group in a second direction different from the first direction to display a second image in the second direction.

A storage medium that stores a laser irradiation program according to an embodiment is a non-transitory storage medium that stores a program which controls a first laser oscillator and a second laser oscillator arranged in a laser array, the program including a step of generating a detection signal that instructs the first laser oscillator to irradiate detection laser light and a step of generating, based on detection information obtained by receiving reflected light that is the detection laser light reflected by a target, a dealing signal that instructs the second laser oscillator to irradiate dealing laser light to the target.

According to the present invention, a process such as detection of a target is efficiently carried out.

DETAILED DESCRIPTION

Figure 1:
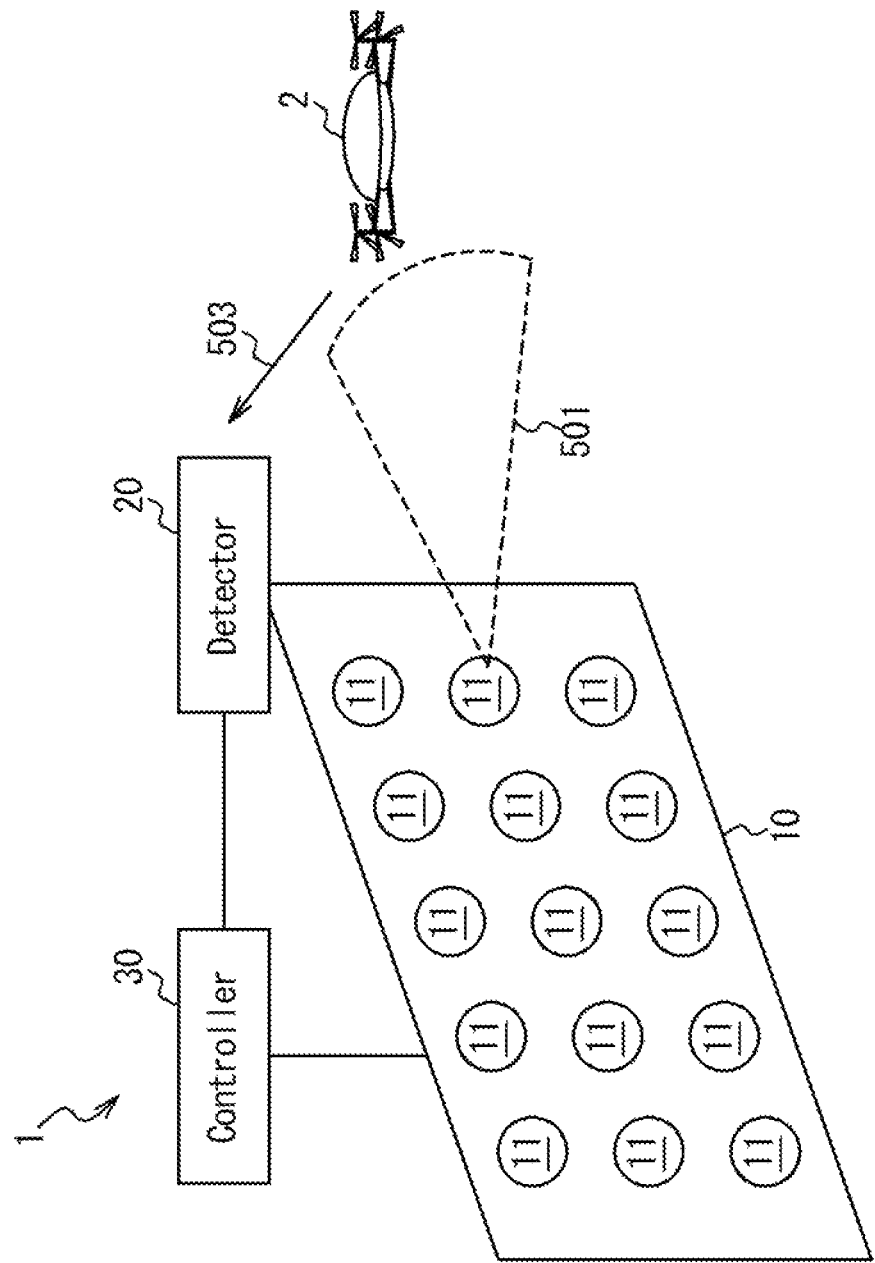
FIG. 1 is a schematic diagram of a laser irradiation apparatus according to an embodiment.

A laser irradiation apparatus 1 according to an embodiment is configured to detect a target 2 by use of output laser light 501 and destroy the target 2. As shown in FIG. 1, the laser irradiation apparatus 1 is provided with a laser array 10, a detector 20 and a controller 30.

The laser array 10 is formed with a plurality of laser oscillators 11 that irradiate output laser light 501 and are arranged in an array on a surface thereof. For example, the laser oscillators 11 may be regularly arranged, in a grid pattern for example. The laser oscillator 11 may be arranged irregularly. The laser oscillators 11 are arranged in the laser array 10 at a high density: for example, 400 or more laser oscillators 11 are arranged per square meter. The laser oscillators 11 may be arranged at a density of ten thousand or more per square.

The laser oscillators 11 can arbitrarily change a direction of irradiating the output laser light 501. For example, the laser oscillator 11 change the direction of irradiating the output laser light 501 non-mechanically and two-dimensionally. When a target 2 such as a drone exists on an optical axis of the output laser light 501 irradiated by the laser oscillator 11, the target 2 reflects the output laser light 501 as reflected light 503. Detail of the laser oscillator 11 will be described later.

The detector 20 receives the reflected light 503 reflected by the target 2 and obtains detection information such as an image in which the target 2 is taken. For example, the detector 20 includes an optical camera such as a visible ray camera, an infrared ray camera and an ultraviolet ray camera, and takes an image of the target 2 irradiated by the output laser light 501. The detector 20 obtains an image in which the target 2 is taken as detection information and transmits it to the controller 30. The detector 20 may select an arbitrary device to detect the reflected light 503.

The controller 30 estimates a position of the target 2 based on the detection information such as the image obtained by the detector 20. The controller 30 extracts a location in the image taken by the detector 20 where the target 2 is shown. The controller 30 estimates the position of the target 2 based on the direction in which the detector 20 has taken the image and the location where the target 2 is shown in the image that has been taken. The controller 30 transmits to the plurality of laser oscillators 11 a request to irradiate the output laser light 501 to the estimated position of the target 2.

The plurality of laser oscillators 11 irradiate the output laser light 501 to the estimated positions of the target 2. For example, all of the laser oscillators 11 that can irradiate to the position of the target 2 may irradiate the output laser light 501 to the position of the target 2. At the position of the target 2, energy of the output laser light 501 is increased by overlaying the output laser light 501 irradiated by the plurality of laser oscillators 11. As a result, the laser irradiation apparatus 1 can destroy the target 2. For this reason, the output laser light 501 irradiated by the laser oscillators 11 may have phases that interfere so that energies of the output laser light 501 strengthen each other at the position of the target 2. In this case, the phase of the output laser light 501 irradiated by each laser oscillator 11 is instructed by the controller 30.

As described above, the laser irradiation apparatus 1 can irradiate output laser light 501 as detection laser light to detect a target 2 and irradiate to the target 2 a plurality of beams of the output laser light 501 as dealing laser light to attack the detected target 2. For this reason, detection of the target 2 and attack on the target 2 can be efficiently performed. It should be noted that the laser array 10 may be provided with a laser oscillator 11 that can irradiate only detection laser light. In addition, the laser array 10 may be provided with a laser oscillator 11 that can irradiate only dealing laser light. All laser oscillators 11 included in the laser array 10 may be configured to be able to irradiate detection laser light and dealing laser light.

Figure 2:
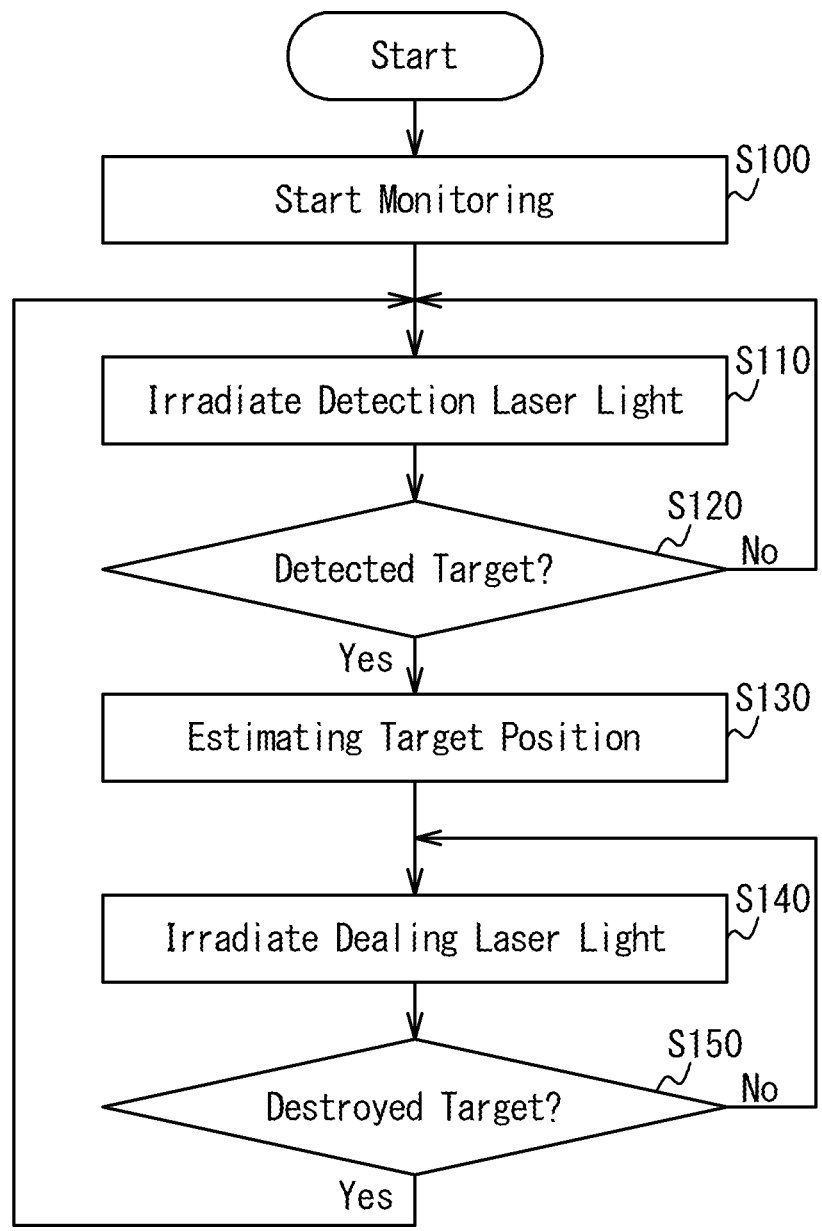
FIG. 2 is a flowchart related to an operation of a laser irradiation apparatus according to an embodiment.

An operation of the laser irradiation apparatus 1 will be described in more detail. The laser irradiation apparatus 1 carries out processes shown in FIG. 2. In step S100, the detector 20 starts a monitoring such as taking images for detecting the target 2 and obtains detection information. A direction in which the detector 20 detects, for example a direction of taking image, may be determined based on an instruction from the controller 30. The direction in which the detector 20 detects may be fixed to a predetermined direction.

Figure 3:
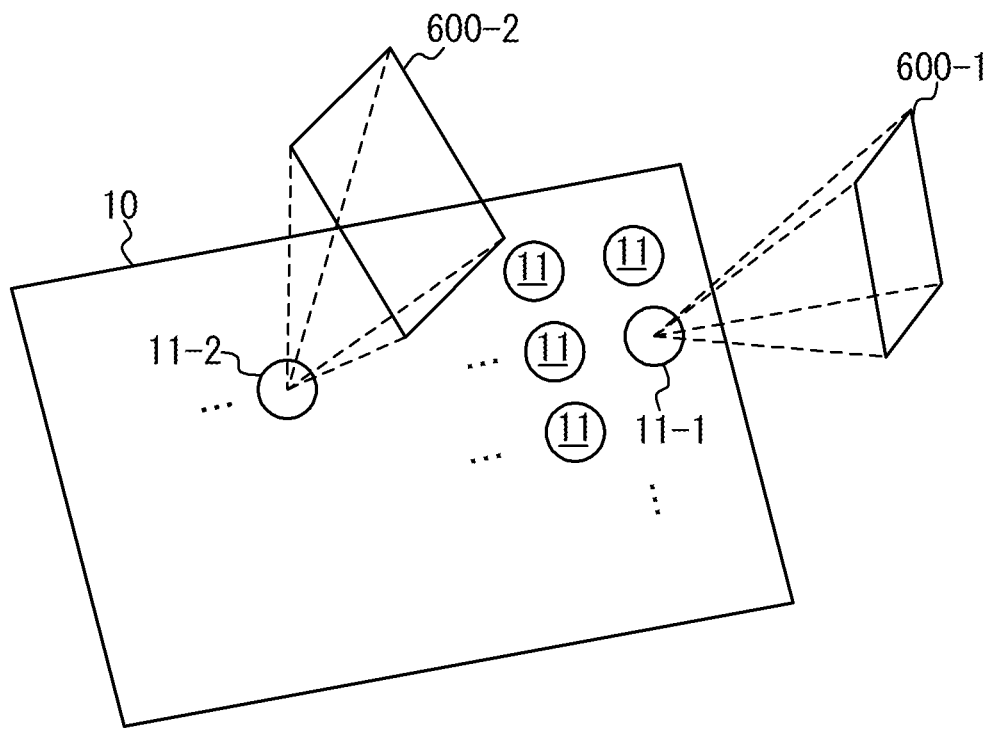
FIG. 3 is a diagram to describe a detection space of a laser irradiation apparatus according to an embodiment.

In step S110, a laser oscillator 11 irradiates output laser light 501 as detection laser light. The controller 30 determines the laser oscillator 11 which irradiates the detection laser light and generates a detection signal which indicates to the determined laser oscillator 11 to irradiate the detection laser light. As the laser oscillator 11 that is to irradiate the detection laser light, one of the laser oscillators 11 that can irradiate detection laser light to a detection space 600 to be detected may be selectively determined. For example, as shown in FIG. 3, the controller 30 transmits a detection signal to a first laser oscillator 11-1 and a second laser oscillator 11-2 of the plurality of laser oscillators 11. A direction of irradiating the detection laser light is indicated in the detection signal. The first laser oscillator 11-1 irradiates detection laser light to a first detection space 600-1 based on the received detection signal. The second laser oscillator 11-2 irradiates detection laser light to a second detection space 600-2 based on the received detection signal. For example, the first detection space 600-1 and the second detection space 600-2 are different spaces. The first detection space 600-1 and the second detection space 600-2 may be overlapped or not overlapped. All laser oscillators 11 provided to the laser array 10 may irradiate detection laser light or a part of the laser oscillators 11 may irradiate detection laser light. A single laser oscillator 11 may irradiate detection laser light.

In step S120, the controller 30 determines whether information of the target 2 is included in the detection information obtained by the detector 20. For example, the controller 30 determines that information of the target 2 is included when there is in an image taken by the detector 20 an area brighter than a predetermined threshold value. When it is determined that the information of the target 2 is included in the detection information, the process proceeds to step S130. When it is determined that the information of the target 2 is not included in the detection information, the process returns to step S110 and the process is repeated until the target 2 is detected.

Figure 4:
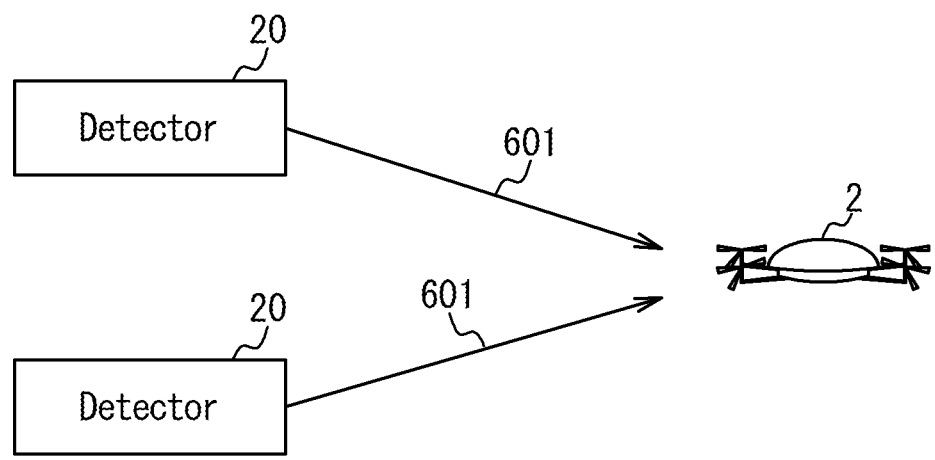
FIG. 4 is a diagram to describe a process of estimating a position of a target according to an embodiment.

In step S130, the controller 30 estimates a position of the target 2 based on the detection information. For example, when the laser irradiation apparatus 1 is provided with a plurality of detectors 20, the controller 30 extracts the location in which the target 2 is shown from the image taken by each of the detectors 20. A target direction 601 from the detector 20 toward the target 2 is estimated based on the extracted position of the target 2 and the direction in which the detector 20 takes image. As shown in FIG. 4, the controller 30 estimates a location in which a straight line elongated along the target direction 601 from each detector 20 toward the target 2 crosses as the position of the target 2.

For example, when the laser oscillator 11 irradiates pulse laser light as detection laser light, the controller 30 estimates a distance from the detector 20 to the target 2 based on a time from when the laser oscillator 11 irradiates the detection laser light to when the detector 20 receives reflected light 503. The target direction 601 from the detector 20 toward the target 2 is estimated based on the detection information obtained by the detector 20. The controller 30 estimates the position of the target 2 based on the distance from the detector 20 to the target 2 and the target direction 601.

In step S140, the controller 30 controls the laser oscillator 11 and irradiates output laser light 501 as dealing laser light to the target 2. The controller 30 determines a plurality of laser oscillators 11 that irradiate dealing laser light and transmits dealing signal for irradiating dealing laser light to the position of the target 2 estimated in step S130 to the determined plurality of laser oscillators 11. The laser oscillators 11 are specified by the dealing signal in the direction of irradiating the dealing laser light and irradiate the dealing laser light in the specified direction. The dealing laser light irradiated by the laser oscillators 11 is overlayed on the target 2 and destroys the target 2.

The laser oscillator 11 that irradiates the dealing laser light is determined based on the position of the target 2. A laser oscillator 11 of the laser oscillators 11, that can irradiate dealing laser light to the target 2, irradiates the dealing laser light to the target 2. For example, all of those laser oscillators 11 may irradiate the dealing laser light to the target 2. In addition, a part of those laser oscillators 11, for example laser oscillators 11 of which irradiation angle is equal to or less than 30 degrees, may irradiate the dealing laser light to the target 2. The irradiation angle indicates an angle between a direction from a laser oscillator 11 toward a center of a space to which the laser oscillator 11 can irradiate output laser light 501 and an irradiation direction of the output laser light 501. It should be noted that a laser oscillator 11 that does not irradiate dealing laser light may irradiate detection laser light as an operation in step S110. The space to which the detection laser light is irradiated may be overlayed to a space in which the laser oscillator 11, that is irradiating dealing laser light, was irradiating detecting laser light. In addition, the space to which this detection laser light is irradiated may include the space in which the laser oscillator 11, that is irradiating dealing laser light, was irradiating detection laser light.

The laser oscillator 11 changes a location to irradiate dealing laser light in accordance with a movement of the target 2. The detector 20 obtains detection information while the laser oscillator 11 is irradiating dealing laser light. Since the target 2 reflects the dealing laser light as reflected light 503, information of the target 2 is included in the detection information. The controller 30 estimates the position of the target 2 based on this detection information, similarly to step S130. Dealing signal with updated position of the target 2 is transmitted to the laser oscillator 11 that is already determined. The laser oscillator 11 irradiates dealing laser light to the updated position of the target 2. The position of the target 2 may be estimated by irradiating detection laser light to the target 2 from a laser oscillator 11 that has not irradiated dealing laser light.

In step S150, the controller 30 determines whether the target 2 is destroyed. The controller 30 verifies whether the target 2 exists at the estimated position of the target 2, based on detection information obtained by the detector 20. For example, the controller 30 determines whether information of the target 2 is included in the detection information, similarly to step S120. When no information of the target 2 is included in the detection information, the controller 30 determines that the target 2 is destroyed. When information of the target 2 is included in the detection information, the position of the target 2 is estimated, similarly to step S130. When the location to which the laser oscillator 11 is irradiating dealing laser light, is not included in the estimated position of the target 2, the controller 30 determines that the target 2 is destroyed. When the estimated position of the target 2 is same as the location to which the laser oscillator 11 is irradiating dealing laser light, the controller 30 determines that the target 2 is not destroyed. When the controller 30 determines that the target 2 is not destroyed, the process returns to step S140 and the laser oscillator 11 continues irradiating the dealing laser light to the target 2. When the controller 30 determines that the target 2 is destroyed, the process returns to step S110 and the laser oscillator 11 irradiates detection laser light.

As described above, the laser irradiation apparatus 1 performs detection and destruction of target 2 by irradiating detection laser light and dealing laser light from laser oscillators 11. Energy of the detection laser light may be smaller than energy of the dealing laser light.

(Irradiation to a Plurality of Targets)

Figure 5:
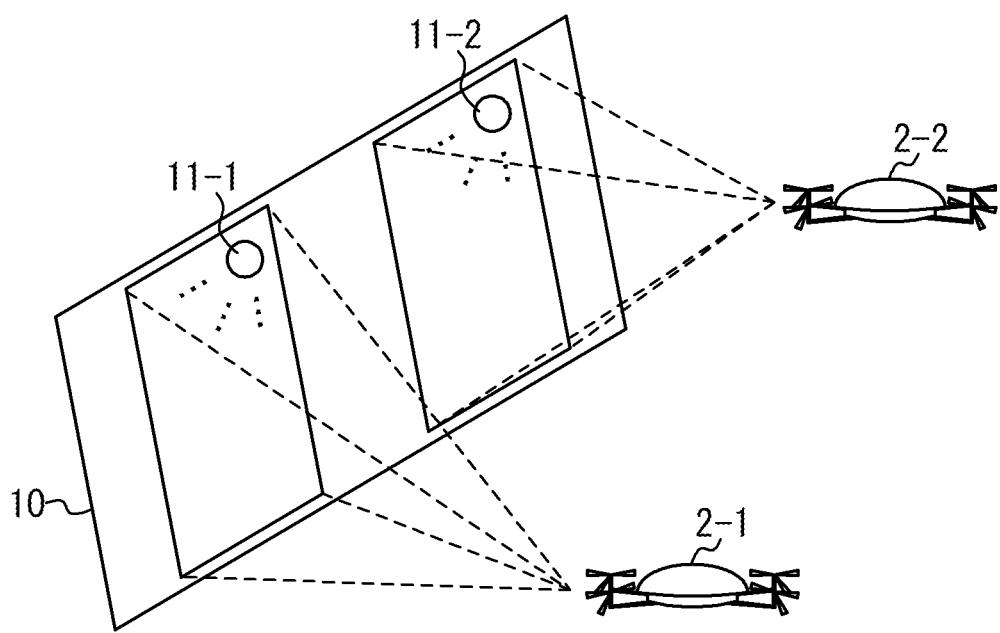
FIG. 5 is a diagram to describe an operation of dealing a plurality of targets according to an embodiment.

As shown in FIG. 5, the laser irradiation apparatus 1 may irradiate dealing laser light to a plurality of targets 2. For example, information of a first target 2-1 and a second target 2-2 is included in the detection information that the detector 20 obtains. The controller 30 estimates a position of the first target 2-1 and a position of the second target 2-2, based on the detection information. The controller 30 determines a laser oscillator 11 that irradiates dealing laser light to the first target 2-1 based on the estimated position of the first target 2-1 and determines a laser oscillator 11 that irradiates dealing laser light to the second target 2-2 based on the estimated position of the second target 2-2. When a first laser oscillator 11-1 that can irradiate dealing laser light to the first target 2-1 is different from a second laser oscillator 11-2 that can irradiate dealing laser light to the second target 2-2, the controller 30 transmits a dealing signal for irradiating dealing laser light to the targets 2 to each laser oscillator 11. The laser oscillators 11 irradiate dealing laser light to the first target 2-1 or the second target 2-2, based on the dealing signal.

When there is a laser oscillator 11 that can irradiate dealing laser light to both of the first target 2-1 and the second target 2-2, the controller 30 determines a target 2 to assign to this laser oscillator 11. For example, the controller 30 may assign a target 2 of which irradiation angle becomes smallest to the laser oscillator 11. A target 2 may be assigned to the laser oscillator 11 so that a number of laser oscillators 11 that irradiates dealing laser light to the first target 2-1 becomes equal to a number of laser oscillators 11 that irradiates dealing laser light to the second target 2-2.

The controller 30 may estimate target information such as a position, a speed, an acceleration and a traveling direction of the target 2 based on the detection information that the detector 20 has obtained, and may determine the target 2 to assign to the laser oscillator 11. For example, the controller 30 may assign a target 2 of which a distance from the laser irradiation apparatus 1 is the shortest to the laser oscillator 11. Based on a position and a speed of the target 2, a target 2 that reaches the laser irradiation apparatus 1 the fastest may be assigned to the laser oscillator 11. To estimate a speed or the like of the target 2, at first, the controller 30 estimates a position of the target 2 at each time based on detection information that the detector 20 has obtained at different times. Next, the controller 30 estimates the speed or the like of the target 2 based on the times at which the detector 20 has obtained the detection information and a position of the target 2 at each time. When the laser irradiation apparatus 1 protects facilities or the like, the controller 30 may assign a target 2 of which a distance from the facilities to protect is the closest to the laser oscillator 11. The target 2 that reaches the facilities to protect the fastest may be assigned to the laser oscillator 11.

The target information may include types of moving objects such as aircraft, drone, flying object and vehicle. The controller 30 may estimate a type of the target 2 such as aircraft, drone, flying object and vehicle based on the detection information that the detector 20 has obtained and may determine the target 2 to assign to the laser oscillator 11. In this case, the controller 30 estimates a shape of the target 2 based on the detection information that the detector 20 has obtained. The controller 30 searches for a registered shape that is the closest to the estimated shape in registered shapes that are registered. The type that corresponds to the registered shape that is searched is estimated as the type of the target 2. A priority that corresponds to the estimated type is searched and a target 2 of which the priority is the highest is assigned to the laser oscillator 11. In this case, registered shapes, types and priorities are registered in association in the controller 30. In addition, a use, a model and the like of moving objects may be included in the target information. In this case, the priority is set to the use, the model and the like of the moving objects.

The controller 30 may calculate a threat level of the target 2 based on the detection information that the detector 20 has obtained and may assign a target 2 of which the threat level is the highest to the laser oscillator 11. The threat level is calculated based on a type, a size, a speed, a traveling direction and the like of the target 2.

The controller 30 may be provided with an input device and may assign a target 2 selected by a user to the laser oscillator 11.

(Irradiation in Accordance with a Movement of a Target)

Figure 6:
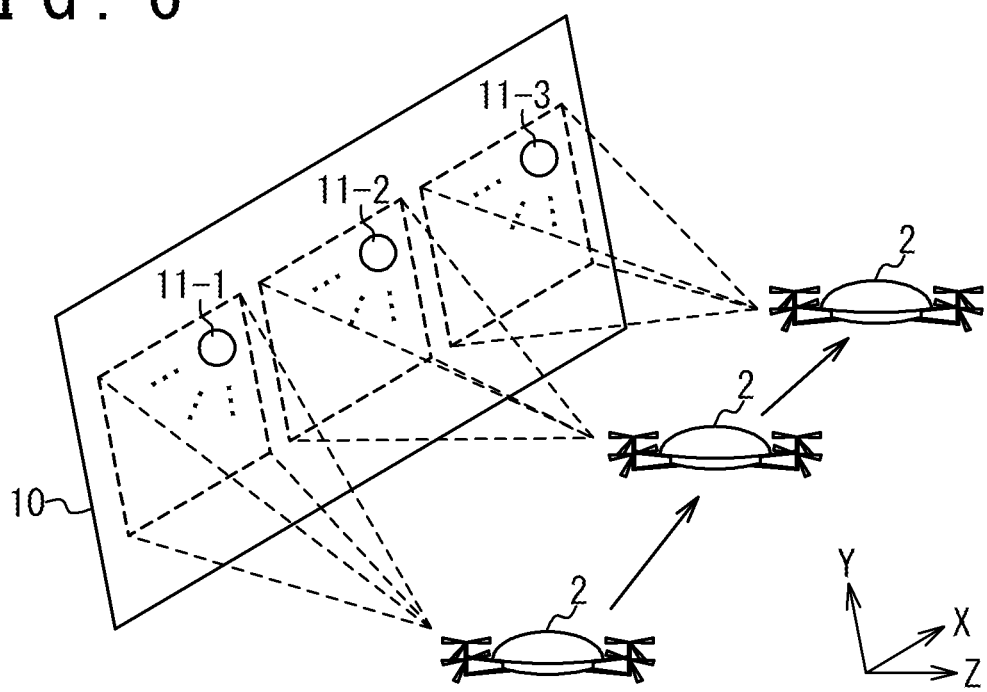
FIG. 6 is a diagram to describe an operation of dealing a moving target according to an embodiment.

As shown in FIG. 6, when the target 2 moves with a speed including a directional component parallel to an in-plane direction of the surface of the laser array 10, the controller 30 may change a laser oscillator 11 that irradiates dealing laser light in accordance with the movement of the target 2. For ease of understanding, it will be described by use of a cartesian coordinate system. It will be described with x direction and y direction as in-plane directions of the surface of the laser array 10 and z direction as normal direction of the surface of the laser array 10.

For example, when the target 2 moves in +x direction, the controller 30 assigns the target 2 to the second laser oscillator 11-2 that is arranged in +x direction from the first laser oscillator 11-1 that is irradiating dealing laser light to the target 2. The controller 30 stops the irradiation of the dealing laser light by the first laser oscillator 11-1. When the target 2 further moves in +x direction, the controller 30 assigns the target 2 to the third laser oscillator 11-3 that is arranged in +x direction from the second laser oscillator 11-2 that is irradiating dealing laser light to the target 2. The controller 30 stops the irradiation of the dealing laser light by the second laser oscillator 11-2.

Figure 7:
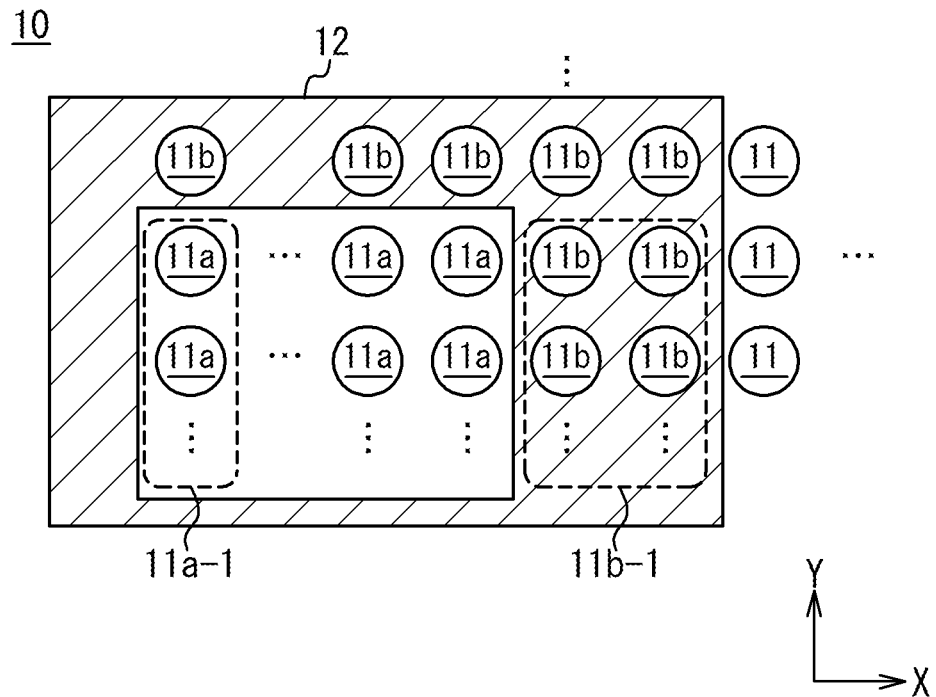
FIG. 7 is an enlarged view of a laser array to describe an operation of dealing a moving target according to an embodiment.

In particular, when the target 2 moves in +x direction, the laser oscillators 11 operate as following. As shown in FIG. 7, irradiation oscillators 11*a* of the laser oscillators 11 are irradiating dealing laser light to the target 2. Adjacent oscillators 11*b* of the laser oscillators 11, that are arranged in an adjacent area 12 that is adjacent to the irradiation oscillators 11*a*, are not irradiating dealing laser light.

When the target 2 moves in +x direction, a part of the adjacent oscillators 11*b* irradiates dealing laser light to the target 2. As the target 2 moves in +x direction, a first adjacent oscillator 11*b*-1 arranged in +x direction from the irradiation oscillators 11*a* can irradiate dealing laser light to the target 2 with an angle with which the irradiation oscillators 11*a* were irradiating. As a result, the controller 30 generates dealing signal so that the first adjacent oscillator 11*b*-1 irradiates dealing laser light to the target 2. The first adjacent oscillator 11*b*-1 irradiates dealing laser light to the target 2 based on the dealing signal.

When the target 2 moves in +x direction, a part of the irradiation oscillators 11*a* stops the irradiation of the dealing laser light. As the target 2 moves in +x direction, a first irradiation oscillator 11*a*-1, which is arranged in −x direction that is a direction opposite to the movement direction of the target 2, cannot irradiate dealing laser light to the target 2 with the angle with which the irradiation oscillators 11*a* were irradiating. For this reason, the controller 30 generates dealing signal for the first irradiation oscillator 11*a*-1 so as to stop the irradiation of the dealing laser light. The first irradiation oscillator 11*a*-1 stops the irradiation of the dealing laser light based on the dealing signal.

The first adjacent oscillator 11*b*-1 may irradiate dealing laser light before the first irradiation oscillator 11*a*-1 stops the irradiation of the dealing laser light. In addition, the first adjacent oscillator 11*b*-1 may irradiate dealing laser light after the first irradiation oscillator 11*a*-1 stopped the irradiation of the dealing laser light. The first adjacent oscillator 11*b*-1 may irradiate dealing laser light at a same time as the first irradiation oscillator 11*a*-1 stops the irradiation of the dealing laser light.

The controller 30 may generate a dealing signal to transmit to the first adjacent oscillator 11*b*-1 before generating a dealing signal to transmit to the first irradiation oscillator 11*a*-1. In addition, the controller 30 may generate a dealing signal to transmit to the first adjacent oscillator 11*b*-1 after generating a dealing signal to transmit to the first irradiation oscillator 11*a*-1. The controller 30 may generate a dealing signal to transmit to the first adjacent oscillator 11*b*-1 at a same time as generating a dealing signal to transmit to the first irradiation oscillator 11*a*-1.

An adjacent oscillator 11*b* arranged in the adjacent area 12 may be controlled so as not to irradiate detection laser light. It can be said that an adjacent oscillator 11*b* is a laser oscillator 11 with high probability of irradiating dealing laser light to the target 2. An irradiation direction of detection laser light is controlled so that detection laser light is irradiated to entire detection space 600. By controlling an adjacent oscillator 11*b* not to irradiate detection laser light, it is suppressed from starting irradiation of dealing laser light while irradiating detection laser light to the detection space 600. A shape of the adjacent area 12 may be changed in accordance with a traveling direction, a speed, an acceleration or the like of the target 2.

The controller 30 can control the laser oscillator 11 in a case in which the target 2 moves in y direction or the like, as in the case of movement in x direction.

Figure 8:
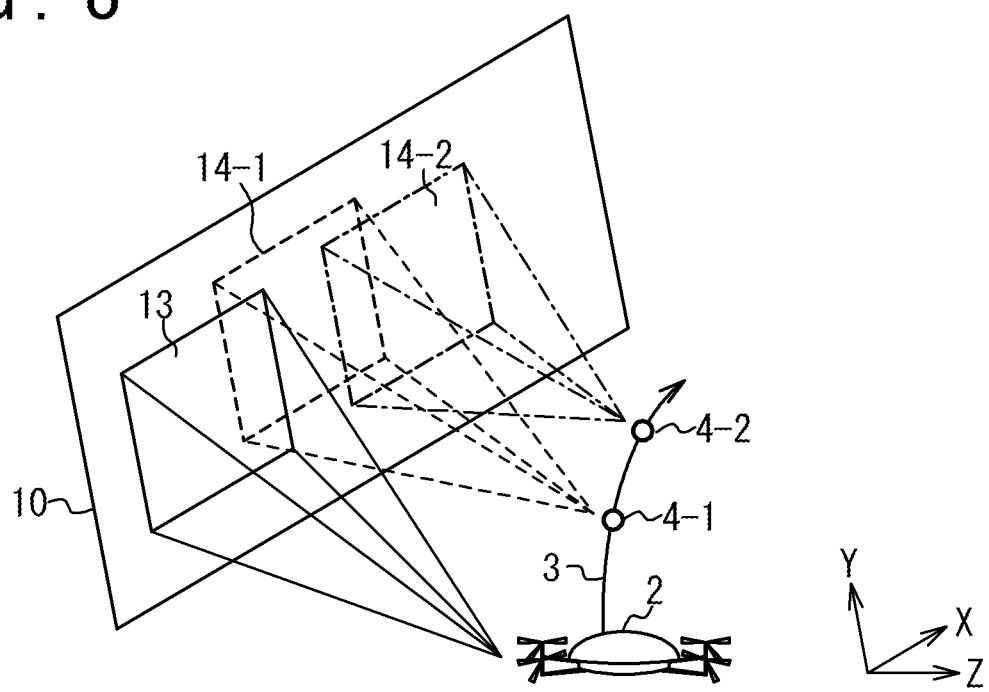
FIG. 8 is a diagram to describe an operation of dealing a moving target according to an embodiment.

As shown in FIG. 8, the controller 30 may estimate an estimation path 3 of the target 2 based on the detection information and may determine a laser oscillator 11 that irradiates dealing laser light to the target 2 based on the estimation path 3. Laser oscillators 11 that are irradiating dealing laser light to the target 2 are arranged in an irradiation area 13. In this case, at first, the controller 30 estimates the estimation path 3 of the target 2. For example, target information such as a position, a speed, an acceleration and a model of the target 2 is estimated based on the detection information that the detector 20 has obtained. The estimation path 3 of the target 2 is estimated based on the estimated target information of the target 2.

Next, the controller 30 determines a laser oscillator 11 that irradiates dealing laser light to the target 2 at desired times, based on the estimation path 3. For example, the controller 30 estimates estimation positions 4 of the target 2 at the desired times, such as a first estimation position 4-1 and a second estimation position 4-2, based on the estimation path 3 of the target 2. A laser oscillator 11 that irradiates dealing laser light when the target 2 reaches the first estimation position 4-1 (for example, a laser oscillator 11 arranged in a first estimation irradiation area 14-1) is determined based on the first estimation position 4-1. Similarly, a laser oscillator 11 that irradiates dealing laser light when the target 2 reaches the second estimation position 4-2 (for example, a laser oscillator 11 arranged in a second estimation irradiation area 14-2) is determined based on the second estimation position 4-2.

The controller 30 determines a schedule for the laser oscillator 11 to irradiate dealing laser light to the target 2 and controls the laser oscillator 11 based on the schedule. The controller 30 determines a schedule for each laser oscillator 11 to irradiate dealing laser light, based on times when the target 2 reaches the estimation positions 4 and the laser oscillators 11 arranged in the estimation irradiation areas 14. The controller 30 generates dealing signal to control the laser oscillators 11, according to this schedule. For example, the dealing signal is transmitted to the laser oscillators 11 arranged in the first estimation irradiation area 14-1 at a time when the target 2 reaches the first estimation position 4-1. As a result, the laser oscillators 11 irradiate dealing laser light to the target 2 in accordance with the determined schedule.

As described above, the controller 30 may determine the schedule for the laser oscillators 11 to irradiate dealing laser light to the target 2 by estimating the estimation path 3 of the target 2. This schedule may be updated when the detector 20 obtains the detection information. As shown in FIG. 5, when a plurality of targets 2 are detected, a laser oscillator 11 that irradiates dealing laser light to each target 2 may be determined.

(Displaying Laser Array)

Figure 9:
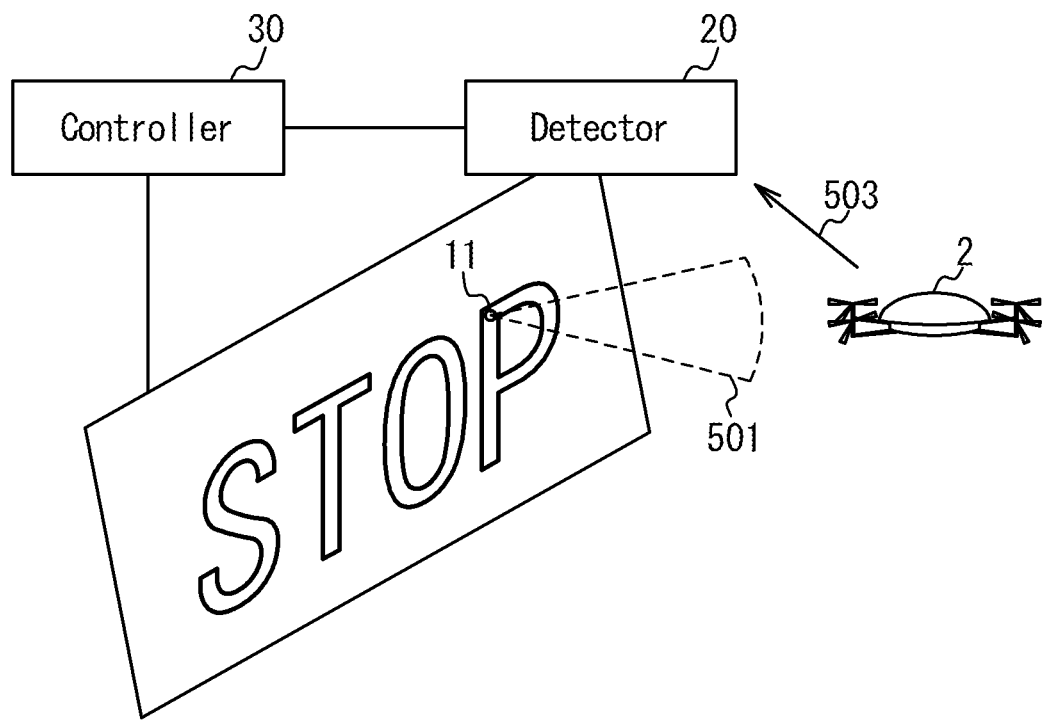
FIG. 9 is a diagram to describe an operation of displaying an image on a laser array according to an embodiment.

As shown in FIG. 9, the controller 30 may select laser oscillators 11 that irradiate detection laser light so that an image such as letters or diagram is displayed on the laser array 10. For example, the controller 30 determines an area in accordance with the shape of the letters "AAA" in the laser array 10 (for example, an area occupied by the letters, an area occupied by edges of the letters or the like). The controller 30 selects the laser oscillators 11 arranged in this area as a laser oscillator group and transmits detection signal that instructs the selected laser oscillator group to irradiate detection laser light. The laser oscillators 11 included in the laser oscillator group irradiate output laser light 501 as detection laser light, based on the detection signal. For this reason, a laser light group including output laser light 501 irradiated by each laser oscillator 11 is irradiated. When viewing the laser array 10 from a direction in which this laser light group is irradiated, the letters "AAA" are displayed. In addition, as the laser oscillators 11 irradiate detection laser light, the detection laser light is reflected by the target 2 and reaches the detector 20. As a result, the detector 20 can detect the target 2. As described above, the laser array 10 can detect the target 2 by displaying letters.

A direction of irradiating detection laser light can be arbitrarily selected in accordance with a direction of displaying an image on the laser array 10. For example, when displaying an image to a plurality of directions, corresponding laser oscillators 11 irradiate detection laser light to the plurality of directions. For example, by setting an interval of irradiating detection laser light to a predetermined direction to $1/25$ second, an image on the laser array 10 is displayed when viewing the laser array 10 from this direction. When a part of laser oscillators 11 selected in accordance with the image is irradiating detection laser light to a first direction, other laser oscillators 11 thereof may irradiate detection laser light to a direction different from the first direction.

Figure 10:
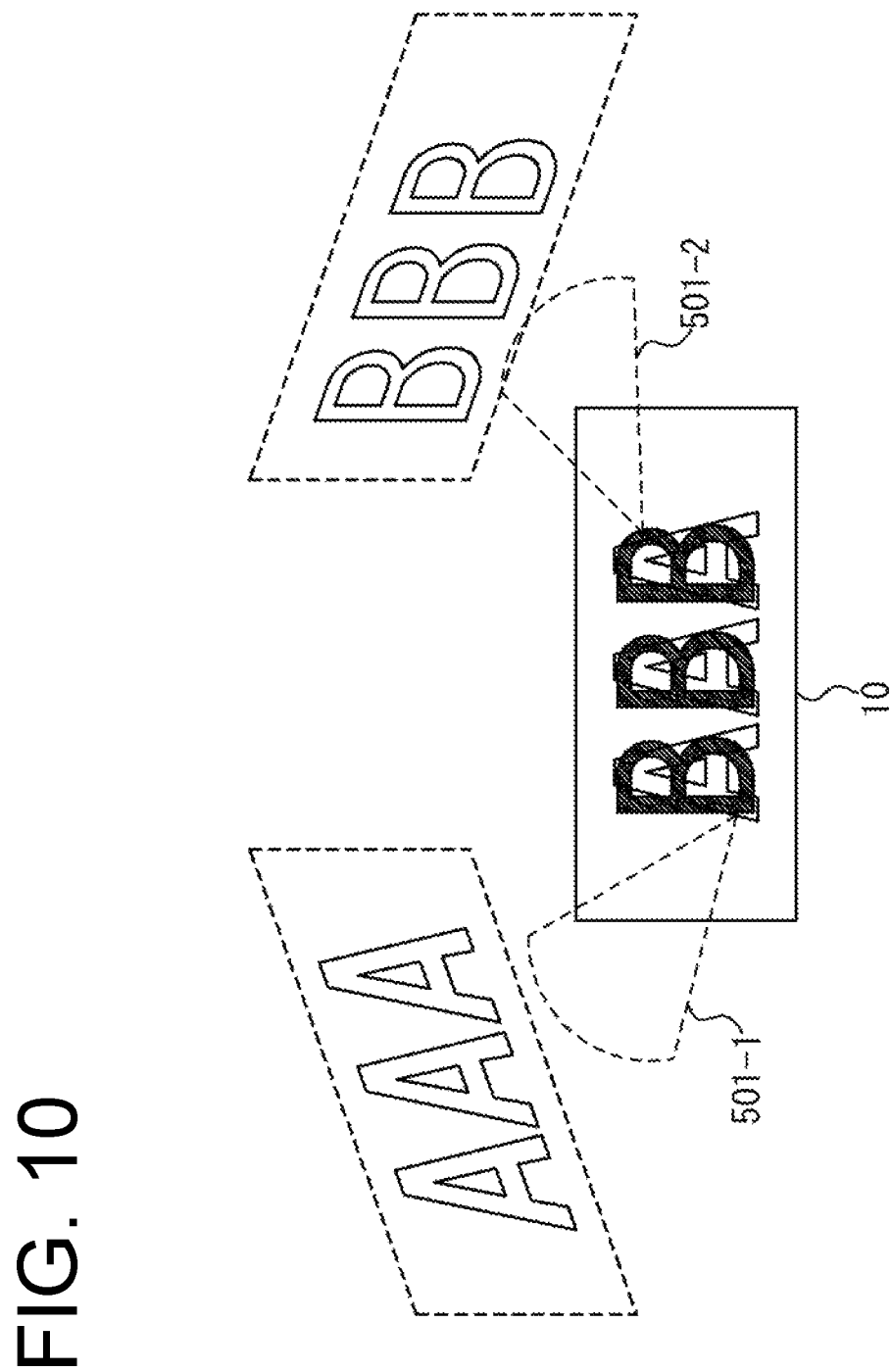
FIG. 10 is a diagram to describe an operation of a laser array that displays different images depending on viewing direction according to an embodiment.

As shown in FIG. 10, the controller 30 may change the image displayed on the laser array 10 in accordance with a direction of viewing the laser array 10.

For example, the controller 30 controls the laser oscillators 11 so as to irradiate the laser light group, in accordance with the shape of a string of letters "AAA", in the first direction. In particular, the controller 30 determines an area on the laser array 10 in accordance with the shape of the string of letters "AAA" and selects the laser oscillators 11 arranged in this area as the first laser oscillator group. The selected first laser oscillator group irradiates a first output laser light 501-1 as detection laser light in the first direction, in accordance with the instruction from the controller 30. As a result, the string of letters "AAA" is displayed when viewing the laser array 10 from the first direction.

Similarly, the controller 30 controls the laser oscillators 11 so as to irradiate a laser light group in accordance with a shape of a string of letters "BBB" in a second direction different from the first direction. In particular, the controller 30 determines an area on the laser array 10 in accordance with a shape of the string of letters "BBB" and selects the laser oscillators 11 arranged in this area as a second laser oscillator group. The selected second laser oscillator group irradiates a second output laser light 501-2 as detection laser light in the second direction, in accordance with the instruction from the controller 30. As a result, the string of letters "BBB" is displayed when viewing the laser array 10 from the second direction.

A laser oscillator 11 included in both of the first laser oscillator group and the second laser oscillator group irradiates detection laser light in the first direction and the second direction. As a result, different images can be displayed in a plurality of directions with a single laser array 10.

(Software Processing)

Figure 11:
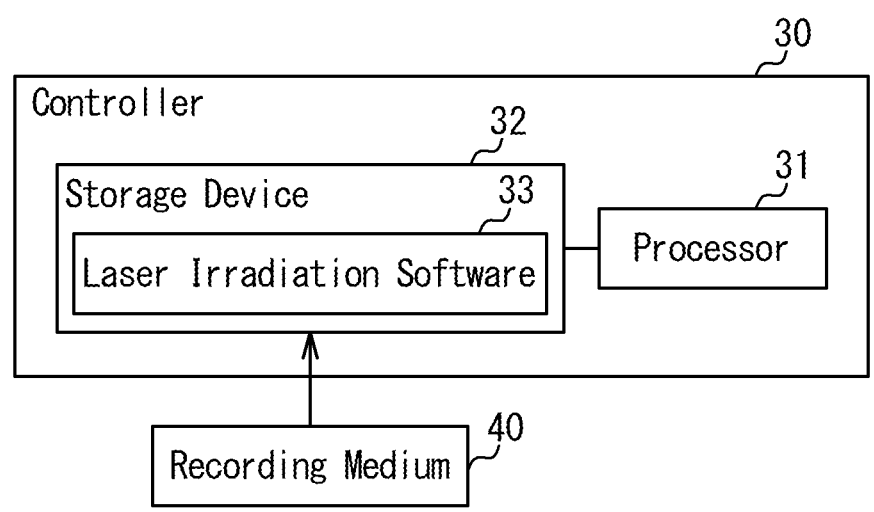
FIG. 11 is a schematic diagram of a controller according to an embodiment.

The controller 30 may control the laser oscillators 11 by software processing. In this case, the controller 30 is provided with a processor 31 and a storage device 32, as shown in FIG. 11.

The storage device 32 stores various data used to control the laser oscillators 11. For example, laser irradiation software 33 is installed in the storage device 32 and the storage device 32 is used as a non-transitory tangible storage medium that stores the laser irradiation software 33. The laser irradiation software 33 may be provided as a computer program product recorded in a computer readable recording medium 40 or may be provided as a computer program product that is downloadable from a server.

The processor 31 executes the laser irradiation software 33 and performs various data processes to control the laser oscillators 11. The processor 31 generates detection signal and dealing signal to control the laser oscillators 11 and estimates a position of the target 2. For example, the laser oscillators 11 irradiate detection laser light based on the detection signal. The processor 31 estimates a position of the target 2 based on reflected light 503 of the detection laser light that the detector 20 has detected. The processor 31 generates dealing signal based on the estimated position. The laser oscillator 11 irradiates dealing laser light to the target 2 based on the dealing signal.

(Laser Oscillator)

A laser oscillator 11 that can non-mechanically change irradiation direction of the output laser light 501 will be described. The laser oscillator 11 is provided with, for example, an optical device 100 and a laser device 200, as shown in FIG. 12.

The laser device 200 is provided around the optical device 100 and is configured to irradiate seed light 500 to an input surface 101 of the optical device 100 from a plurality of directions. The optical device 100 is configured to irradiate the seed light 500, that is irradiated to the input surface 101, as the output laser light 501 from an output surface 102. A direction in which the output laser light 501 is irradiated is determined based on wavelength and irradiation direction of the seed light 500 that the laser device 200 irradiates to the optical device 100. The wavelength and the irradiation direction of the seed light 500 are configured so as to be controlled by the controller 30.

The seed light 500 is a generic term of first seed light 500-1 (not illustrated), second seed light 500-2 (not illustrated), ..., and N-th seed light 500-N (not illustrated) of which irradiation directions are different. The output laser light 501 is a generic term of first output laser light 501-1 (not illustrated), second output laser light 501-2 (not illustrated), ..., and N-th output laser light 501-N that are irradiated when each of the seed light 500 is irradiated to the optical device 100. When the first seed light 500-1 is irradiated to the optical device 100, the optical device 100 irradiates the first output laser light 501-1. When the second seed light 500-2 is irradiated to the optical device 100, the optical device 100 irradiates the second output laser light 501-2. When the N-th seed light 500-N is irradiated to the optical device 100, the optical device 100 irradiates the N-th output laser light 501-N.

Figure 12:
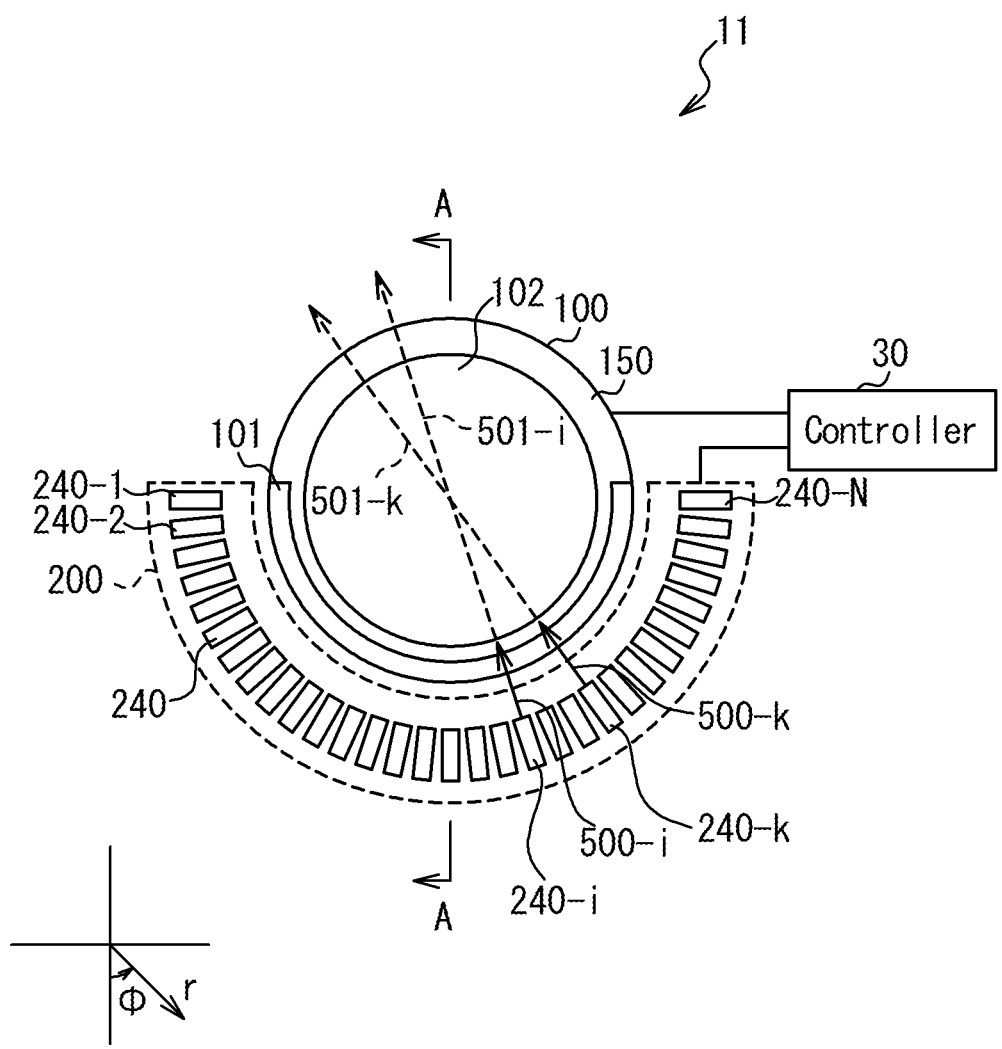
FIG. 12 is a schematic diagram of a laser oscillator according to an embodiment.
Figure 13:
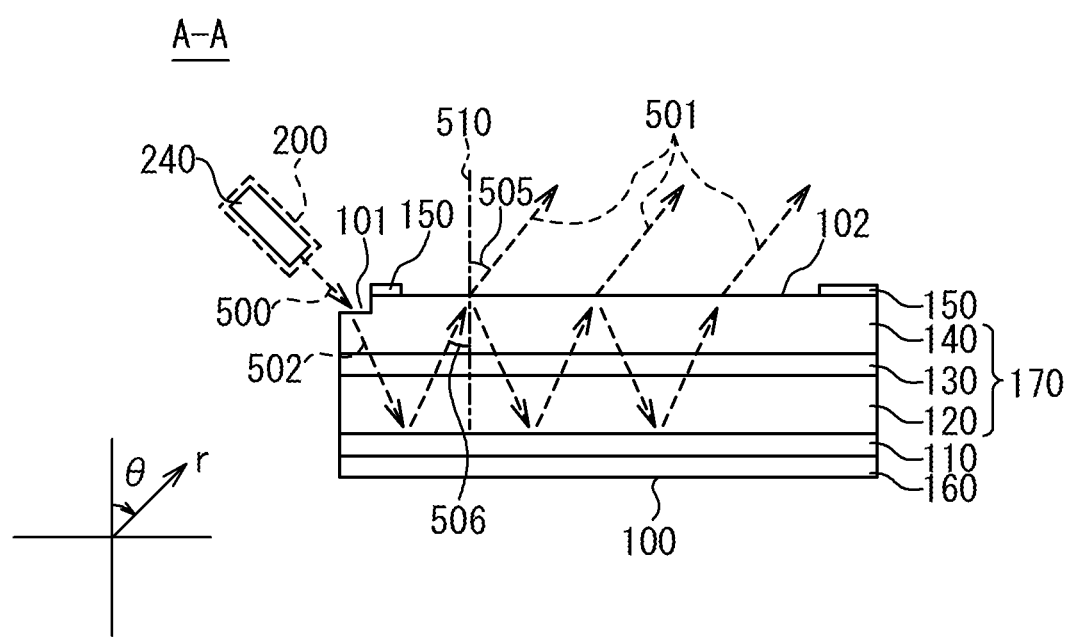
FIG. 13 is an A-A cross-sectional view in FIG. 12.

As shown in FIGS. 12 and 13, the optical device 100 is formed in a cylindric shape, for example, and has an input surface 101 and an output surface 102 in one bottom surface. The input surface 101 is a plane surface provided at an edge portion of this bottom surface for example, and is configured so as to be irradiated by the laser device 200 with the seed light 500. The output surface 102 is a plane surface provided to this bottom surface and is configured to irradiate the output laser light 501. The output surface 102 may be formed in a circular shape in a center of this bottom surface, for example.

The optical device 100 is formed with a second reflection mirror 120, an active layer 130, a first reflection mirror 140 and a first electrode 150 that are laminated on one surface of a substrate 110 in order. Boundaries between each layer are provided in parallel to a bottom surface of the optical device 100 for example, the output surface 102 for example. In addition, a second electrode 160 is provided adjacent to another surface of the substrate 110.

The first reflection mirror 140 has an input surface 101 at an end portion of a surface thereof, for example. The seed light 500 irradiated from the laser device 200 is incident from the input surface 101 to the first reflection mirror 140. For this reason, the input surface 101 is configured so that a reflectance thereof is lower compared to another portion of the surface of the first reflection mirror 140. For example, the first reflection mirror 140 is formed so that a thickness of the first reflection mirror 140 at a position where the input surface 101 is provided is thinner than a thickness of the first reflection mirror 140 at another position. The input surface 101 is, for example, a plane surface parallel to the output surface 102.

Laser light incident from the input surface 101 travels inside the optical device 100 as propagation laser light 502. The propagation laser light 502 is a generic term of first propagation laser light 502-1, second propagation laser light 502-2, ..., and N-th propagation laser light 502-N which propagate in the optical device 100 when each of the seed light 500 is irradiated. In particular, when the first seed light 500-1 is irradiated to the optical device 100, it travels in the optical device 100 as the first propagation laser light 502-1. When the second seed light 500-2 is irradiated to the optical device 100, it travels in the optical device 100 as the second propagation laser light 502-2. When the N-th seed light 500-N is irradiated to the optical device 100, it travels in the optical device 100 as the N-th propagation laser light 502-N.

The first reflection mirror 140 and the second reflection mirror 120 are provided to face to each other and form a planar waveguide 170 between the first reflection mirror 140 and the second reflection mirror 120. In particular, the second reflection mirror 120 reflects the propagation laser light 502 incident from the input surface 101. A portion of the propagation laser light 502 reflected by the second reflection mirror 120 is reflected to the first reflection mirror 140. The propagation laser light 502 reflected by the first reflection mirror 140 is reflected by the second reflection mirror 120. As described above, the propagation laser light 502 is reflected by the first reflection mirror 140 and the second reflection mirror 120 in order to travel in the planar waveguide 170. The first reflection mirror 140 and the second reflection mirror 120 are formed so as to carry out Bragg reflection and include a Distributed Bragg Reflector for example.

The first reflection mirror 140 transmits a portion of the propagation laser light 502 and reflects another portion thereof. The propagation laser light 502 reflected by the first reflection mirror 140 travels inside the optical device 100. The propagation laser light 502 transmitted through the first reflection mirror 140 is irradiated from the output surface 102 formed on the surface of the first reflection mirror 140 as the output laser light 501.

On the other hand, the second reflection mirror 120 may reflect the whole propagation laser light 502. For this reason, the reflectance of the first reflection mirror 140 may be configured to be lower than the reflectance of the second reflection mirror 120. For example, the thickness of the first reflection mirror 140 may be thinner than the thickness of the second reflection mirror 120.

The active layer 130 is provided between the first reflection mirror 140 and the second reflection mirror 120 and amplifies the propagation laser light 502 passing through the active layer 130. When the propagation laser light 502 travels in the planar waveguide 170, a portion of the propagation laser light 502 is irradiated as the output laser light 501 and another portion of the propagation laser light 502 is amplified by the active layer 130.

The active layer 130 is excited by a current that flows between the first electrode 150 and the second electrode 160. For example, the active layer 130 may be excited until it becomes a luminescent state. The first electrode 150 and the second electrode 160 are provided to sandwich the active layer 130.

The first electrode 150 and the second electrode 160 are connected to the controller 30. The controller 30 draws a current between the first electrode 150 and the second electrode 160 and excites the active layer 130. The controller 30 adjusts the amplification of the propagation laser light 502 by the active layer 130, by controlling the current which flows in the active layer 130.

As shown in FIG. 12, the first electrode 150 is formed so as not to overlap the input surface 101 irradiated with the seed light 500 and the output surface 102 irradiated with the output laser light 501. The input surface 101 is provided at an edge portion of the optical device 100 in a direction in which the seed light 500 is irradiated. The output surface 102 is formed, for example, in a circular shape in a center of the bottom surface of the optical device 100.

As described above, the optical device 100 propagates the propagation laser light 502 along the planar waveguide 170 provided between the first reflection mirror 140 and the second reflection mirror 120, and irradiates the output laser light 501 from the output surface 102. The optical device 100 includes a Vertical Cavity Surface Emitting LASER (VCSEL) for example. For example, a diameter of the output surface 102 of the optical device 100 may be 1 cm.

The laser device 200 is provided with a plurality of seed light sources 240 (a first seed light source 240-1, a second seed light source 240-2, . . . , a N-th seed light source 240-N), for example.

The seed light sources 240 irradiate the seed light 500 to the optical device 100. For example, each of the seed light sources 240, with different direction of irradiating the seed light 500, irradiates the first seed light 500-1, the second seed light 500-2, . . . , and the N-th seed light 500-N. In particular, the first seed light source 240-1 irradiates the first seed light 500-1 to the optical device 100. The second seed light source 240-2 irradiates the second seed light 500-2 to the optical device 100. The N-th seed light source 240-N irradiates the N-th seed light 500-N to the optical device 100. A portion of the seed light sources 240, the first seed light source 240-1 and the second seed light source 240-2 for example, may irradiate the seed light 500 in a same direction. In addition, the seed light source 240 may be connected to a device that outputs the seed light 500 via an optical switch and may be configured to irradiate the seed light 500 outputted by this device. In this case, the optical switch selects a seed light source 240 that irradiates the seed light 500. An example of the seed light source 240 includes a collimator, a fiber array that bundles optical fibers, and the like.

The seed light sources 240 are arranged to surround the optical device 100. The seed light sources 240 are arranged to surround a half of the optical device 100 when viewed from a normal direction of the output surface 102 for example, and each of the seed light sources 240 is arranged at equal intervals.

For ease of understanding, it will be described by use of a spherical coordinate system with a center of the output surface 102 as its origin. A distance from the origin will be referred to as a radius r, an angle from a normal line 510 of the output surface 102 will be referred to as a polar angle $\theta$ and a direction in a planar direction of the output surface 102 when viewed from the origin will be referred to as an azimuthal $\phi$.

A method of controlling the azimuthal $\phi$ of the irradiation direction of the output laser light 501 will be described. The laser device 200 irradiates the seed light 500 to the optical device 100 from an i-th seed light source 240-$i$ and a k-th seed light source 240-$k$, for example. Azimuthal $\phi$ of the irradiation direction of the seed light 500 that the i-th seed light source 240-$i$ and the k-th seed light source 240-$k$ irradiate is not parallel to each other. As the input surface 101 is a plane surface, the azimuthal $\phi$ of the traveling direction of the i-th propagation laser light 502-$i$ corresponding to the i-th seed light 500-$i$ and the azimuthal $\phi$ of the traveling direction of the k-th propagation laser light 502-$k$ corresponding to the k-th seed light 500-$k$ are not parallel to each other. As the output surface 102 is a plane surface, the azimuthal $\phi$ of the irradiation direction of the i-th output laser light 501-$i$ corresponding to the i-th propagation laser light 502-$i$ and the azimuthal $\phi$ of the irradiation direction of the k-th output laser light 501-$k$ corresponding to the k-th propagation laser light 502-$k$ are not parallel to each other. As described above, the azimuthal $\phi$ of the irradiation direction of the output laser light 501 when the seed light 500 is irradiated from the i-th seed light source 240-$i$ and the azimuthal $\phi$ of the irradiation direction of the output laser light 501 when the seed light 500 is irradiated from the k-th seed light source 240-$k$ are different. The azimuthal $\phi$ of the irradiation direction of the output laser light 501 can be changed by changing the seed light source 240 that is to irradiate the seed light 500.

As described above, the laser oscillators 11 can control the azimuthal $\phi$ of the irradiation direction of the output laser light 501 by changing the seed light source 240 that irradiates the seed light 500. In other words, the azimuthal $\phi$ of the irradiation direction of the output laser light 501 can be controlled by irradiation by the laser device 200 of a plurality of beams of seed light 500 of which the azimuthal $\phi$ of the traveling direction is not parallel to each other in the planar waveguide 170. A plurality of optical paths of the propagation laser light 502, that is irradiated from a plurality of seed light sources 240 and travels inside the optical device 100, may cross each other inside the planar waveguide 170 formed in the optical device 100, when viewed from the normal direction of the output surface. For example, an optical path of the i-th propagation laser light 502-$i$ and an optical path of the k-th propagation laser light 502-$k$ may cross inside the planar waveguide 170 when viewed from the normal direction of the output surface. It should be noted that two seed light sources 240 of the plurality of seed light sources 240 may irradiate seed light 500 to the optical device 100 from parallel directions.

The polar angle $\theta$ of the irradiation direction of the output laser light 501 can be changed by changing a wavelength of the seed light 500 irradiated from the seed light source 240. As shown in FIG. 13, the seed light 500 is irradiated to the input surface 101 from a direction inclined with respect to the normal direction of the input surface 101 and is guided inside the optical device 100 as the propagation laser light 502. The propagation laser light 502 is reflected by the first reflection mirror 140 and the second reflection mirror 120. When an incident angle 506 of the propagation laser light 502 at the first reflection mirror 140 is referred to as $\theta_i$, the following equation (1) holds based on Bragg's law.

[Math Equation 1]

$$\sin\theta_i = \sqrt{1 - \left(\frac{\lambda}{\lambda_c}\right)^2} \quad (1)$$

Herein, the incident angle 506 indicates an angle between an incident direction of the propagation laser light 502 with respect to the first reflection mirror 140 and the normal line 510 of the output surface 102. In addition, λ indicates a wavelength of the propagation laser light 502 and $\lambda_c$ indicates a cut-off wavelength of the planar waveguide 170.

The first reflection mirror 140 transmits a portion of the propagation laser light 502, which is incident with an incident angle 506, as the output laser light 501. The output laser light 501 is refracted at the output surface 102, which is provided to the first reflection mirror 140, and is irradiated. As the wavelength of the output laser light 501 is equal to the wavelength of the propagation laser light 502, when an output angle 505 which indicates an angle between a direction in which the output laser light 501 is irradiated and the normal line 510 of the output surface 102 is referred to as $\theta_0$, the following equation (2) holds.

[Math Equation 2]

$$\sin\theta_o = \frac{n_{air}}{n_{wg}}\sqrt{1 - \left(\frac{\lambda}{\lambda_c}\right)^2} \quad (2)$$

Herein, $n_{air}$ indicates a refraction index of the atmosphere and $n_{wg}$ indicates a refraction index of the planar waveguide 170.

As the wavelength of the propagation laser light 502 and the wavelength of the output laser light 501 are equal to the seed light 500, the output angle 505 varies based on the wavelength of the seed light 500. As the output angle 505 indicates a polar angle θ of the direction in which the output laser light 501 is irradiated, the polar angle θ of the direction in which the output laser light 501 is irradiated is changed based on the wavelength of the seed light 500. As a result, the laser oscillator 11 can control the polar angle θ of the irradiation direction of the output laser light 501 by changing the wavelength of the seed light 500.

As described above, the laser oscillator 11 can change non-mechanically and two-dimensionally the direction of the output laser light 501 to irradiate by controlling the seed light source 240 that irradiates the seed light 500 and the wavelength of the laser light that the seed light source 240 irradiates. For example, the laser oscillator 11 can change a polar angle and an azimuthal of the direction to irradiate laser light in a spherical coordinate system with a position of outputting the laser light as an origin and a direction of irradiating the laser light as a zenith.

When the laser irradiation apparatus 1 is provided with the laser oscillator 11 shown in FIGS. 12 and 13, the controller 30 can control the irradiation direction of the output laser light 501 by selecting the wavelength of the seed light 500 and the seed light source 240. Output energy of the output laser light 501 is adjusted by a control of the controller 30 on a current which flows between the first electrode 150 and the second electrode 160, and output energy of the seed light 500.

A direction in which each of the laser oscillators 11 can irradiate output laser light 501 may not be identic. For example, directions in which adjacent laser oscillators 11 can irradiate output laser light 501 may be different. As directions in which adjacent laser oscillators 11 can irradiate output laser light 501 are different, irradiation directions can be completed. As a result, directions in which the laser array 10 can irradiate output laser light 501 can be widened.

Although the present invention has been described above with reference to the embodiments and the examples, the present invention is not limited to the embodiments and the examples described above. A person skilled in the art can appropriately make various modifications or changes to the structure and details of the present invention within the scope of the technical idea of the present invention described in the claims. In addition, the above-described embodiments and examples may be combined as long as there is no technical contradiction. For example, the process described above is an example, and the order and processing contents of each step may be changed as long as the function is not inhibited. In addition, the described configuration may be arbitrarily changed as long as the function is not inhibited.

It should be noted that the present application claims priority based on the Japanese Patent Application No. 2019-011203 filed on Jan. 25, 2019, and herein incorporates all disclosure thereof by reference.

The invention claimed is:

1. A laser irradiation apparatus comprising:
 a laser array comprising a plurality of laser oscillators including a first laser oscillator configured to irradiate detection laser light and a second laser oscillator configured to irradiate dealing laser light for attacking a target;
 a detector configured to obtain detection information based on reflected light that is the detection laser light reflected by a target; and
 a controller configured to estimate a position of the target based on the detection information and generate a dealing signal for the second laser oscillator, the dealing signal being a signal for instructing the second laser oscillator to irradiate the dealing laser light to the estimated position of the target,
 wherein the second laser oscillator is further configured to irradiate the dealing laser light to the estimated position of the target based on the dealing signal for the second laser oscillator,
 wherein the detector is further configured to obtain the detection information including information that indicates a position of the target when the target is irradiated with the dealing laser light,
 wherein the controller is further configured to:
  estimate a position of the target based on the detection information; and
  generate a dealing signal for a third oscillator that instructs a third laser oscillator arranged in a movement direction of the target to irradiate dealing laser light based on a oscillator that instructs the second laser oscillator arranged in a direction opposite to the movement direction of the target to stop irradiating the dealing laser light,
 wherein the plurality of laser oscillators further includes the third laser oscillator configured to irradiate the dealing laser light to the estimated position of the target based on the dealing signal for the third laser oscillator, and
 wherein the second laser oscillator is further configured to stop irradiating the dealing laser light to the estimated position of the target based on the dealing stop signal for the second laser oscillator.

2. The laser irradiation apparatus according to claim 1,
wherein the controller is further configured to generate, when the second laser oscillator is irradiating the dealing laser light, a dealing signal for the first laser oscillator that instructs the first laser oscillator to irradiate dealing laser light to the estimated position of the target, and
wherein the first laser oscillator is further configured to irradiate the dealing laser light to the estimated position of the target based on the dealing signal for the first laser oscillator.

3. The laser irradiation apparatus according to claim 1,
wherein the plurality of laser oscillators further includes a fourth laser oscillator configured to be able to irradiate the detection laser light when the second laser oscillator is irradiating the dealing laser light.

4. The laser irradiation apparatus according to claim 3,
wherein the controller is further configured to control the fourth laser oscillator so that a space irradiated with the detection laser light by the fourth laser oscillator overlaps a space irradiated with the detection laser light by the first laser oscillator.

5. The laser irradiation apparatus according to claim 1,
wherein the plurality of laser oscillators further includes a fourth laser oscillator and a fifth laser oscillator configured to irradiate detection laser light, and
wherein the controller is further configured to control the fifth laser oscillator so that a space irradiated with the detection laser light by the fifth laser oscillator does not overlap the space irradiated with the first detection laser light by the first laser oscillator.

6. The laser irradiation apparatus according to claim 1,
wherein the plurality of laser oscillators further includes a fourth laser oscillator, a fifth laser oscillator, and a sixth laser oscillator,
wherein the target comprises a plurality of targets, and wherein the detector is further configured to detect the plurality of targets including a first target and a second target to obtain the detection information,
wherein the controller is further configured to:
estimate a position of the first target and a position of the second target based on the detection information; and
generate the dealing signal for the second laser oscillator that instructs to irradiate the dealing laser light to the estimated position of the first target and a dealing signal for the sixth laser oscillator that instructs to irradiate dealing laser light to the estimated position of the second target,
wherein the second laser oscillator is further configured to irradiate the dealing laser light for the second laser oscillator to the estimated position of the first target based on the dealing signal for the second laser oscillator, and
wherein the plurality of laser oscillators further includes a sixth laser oscillator configured to irradiate the dealing laser light to the estimated position of the second target based on the dealing signal for the sixth laser oscillator.

7. The laser irradiation apparatus according to claim 1,
wherein the controller is further configured to generate the dealing stop signal for the second laser oscillator that gives an instruction to the second laser oscillator after generating the dealing signal for the third laser oscillator that gives an instruction to the third laser oscillator.

8. The laser irradiation apparatus according to claim 1,
wherein the controller is further configured to:
estimate a path of the target based on the detection information;
estimate a position of the target at a desired time based on the estimated path of the target; and
generate the dealing signal for the third laser oscillator that instructs the third laser oscillator to irradiate the dealing laser light to the estimated position of the target at the desired time.

9. The laser irradiation apparatus according to claim 1,
wherein the plurality of laser oscillators includes a first laser oscillator group,
wherein the first laser oscillator group is configured to irradiate a first laser light group in a first direction to display a first image in the first direction, and
wherein the first laser oscillator is included in the first laser oscillator group.

10. The laser irradiation apparatus according to claim 9,
wherein the controller is further configured to select the first laser oscillator group from the plurality of laser oscillators based on the first image.

11. The laser irradiation apparatus according to claim 9,
wherein the plurality of laser oscillators includes a second laser oscillator group configured to irradiate a second laser light group in a second direction to display a second image in the second direction.

12. The laser irradiation apparatus according to claim 11,
wherein the controller is further configured to select the second laser oscillator group from the plurality of laser oscillators based on the second image.

13. The laser irradiation apparatus according to claim 11,
wherein a part of laser oscillators of the first laser oscillator group is included in the second laser oscillator group.

14. A laser irradiation apparatus comprising a laser array with a plurality of laser oscillators arranged in an array,
wherein the plurality of laser oscillators comprises:
a first laser oscillator group including a part of laser oscillators of the plurality of laser oscillators; and
a second laser oscillator group including a part of laser oscillators of the plurality of laser oscillators,
wherein the first laser oscillator group is configured to irradiate a detection laser light group in a first direction to display a first image in the first direction, and
wherein the second laser oscillator group is configured to irradiate a dealing laser light group in a second direction different from the first direction to display a second image in the second direction and for attacking a target;
a detector configured to obtain detection information based on reflected light that is the detection laser light group reflected by a target; and
a controller configured to estimate a position of the target based on the detection information and generate a dealing signal for the second laser oscillator group, the dealing signal being a signal for instructing the second laser oscillator group to
irradiate the dealing laser light group to the estimated position of the target,
wherein the second laser oscillator group is further configured to irradiate the dealing laser light group to the estimated position of the target based on the dealing signal for the second laser oscillator group,
wherein the detector is further configured to obtain the detection information including information that indicates a position of the target when the target is irradiated with the dealing laser light group, wherein the controller is further configured to:
estimate a position of the target based on the detection information; and
generate a dealing signal for a third oscillator group that instructs a third laser oscillator group arranged in a movement direction of the target to irradiate a dealing laser light group based on a movement of the estimated position of the target and a dealing stop signal for the second laser oscillator group that instructs the second laser oscillator group arranged in a direction opposite to the movement direction of the target to stop irradiating the dealing laser light group,
wherein the plurality of laser oscillators further includes the third laser oscillator group configured to irradiate the dealing laser light group to the estimated position of the target based on the dealing signal for the third laser oscillator group, and
wherein the second laser oscillator group is further configured to stop irradiating the dealing laser light group to the estimated position of the target based on the dealing stop signal for the second laser oscillator group.

15. A non-transitory storage medium configured to store a laser irradiation program to be executed by a processor to control a first laser oscillator, a second laser oscillator, and a third laser oscillator arranged in a laser array, the program including:

a step of generating a detection signal configured to instruct the first laser oscillator to irradiate detection laser light;
a step of generating, based on detection information obtained by receiving reflected light that is the detection laser light reflected by a target, a dealing signal configured to instruct the second laser oscillator to irradiate dealing laser light to the target;
obtaining the detection information including information that indicates a position of the target when the target is irradiated with the dealing laser light;
estimating a position of the target based on the detection information; and
generating a dealing signal for a third oscillator that instructs a third laser oscillator arranged in a movement direction of the target to irradiate dealing laser light based on a oscillator that instructs the second laser oscillator arranged in a direction opposite to the movement direction of the target to stop irradiating the dealing laser light,
wherein the third laser oscillator irradiates the dealing laser light to the position of the target based on the dealing signal for the third laser oscillator, and
wherein the second laser oscillator stops irradiating the dealing laser light to the position of the target based on the dealing stop signal for the second laser oscillator.

* * * * *